United States Patent
Hood

(10) Patent No.: US 9,590,123 B2
(45) Date of Patent: Mar. 7, 2017

(54) SOLAR MODULES, SUPPORTING LAYER STACKS AND METHODS OF FABRICATING THEREOF

(71) Applicant: Thomas G. Hood, Portola Valley, CA (US)

(72) Inventor: Thomas G. Hood, Portola Valley, CA (US)

(73) Assignee: GIGA SOLAR FPC, Portola Valey, CA (US)

( * ) Notice: Subject to any disclaimer, the term of this patent is extended or adjusted under 35 U.S.C. 154(b) by 134 days.

(21) Appl. No.: 14/359,102

(22) PCT Filed: Oct. 12, 2012

(86) PCT No.: PCT/US2012/059836
§ 371 (c)(1),
(2) Date: May 18, 2014

(87) PCT Pub. No.: WO2013/074224
PCT Pub. Date: May 23, 2013

(65) Prior Publication Data
US 2014/0290744 A1 Oct. 2, 2014

Related U.S. Application Data

(60) Provisional application No. 61/561,337, filed on Nov. 18, 2011.

(51) Int. Cl.
*H01L 31/042* (2014.01)
*H01L 31/18* (2006.01)
(Continued)

(52) U.S. Cl.
CPC ............ *H01L 31/0422* (2013.01); *B32B 7/12* (2013.01); *B32B 15/046* (2013.01); *B32B 15/18* (2013.01);
(Continued)

(58) Field of Classification Search
CPC ....... B32B 15/046; B32B 15/18; B32B 15/20; B32B 27/065; B32B 7/12; B32B 2266/0264; B32B 2250/40; B32B 2307/71
See application file for complete search history.

(56) References Cited

U.S. PATENT DOCUMENTS 5,800,631 A * 9/1998 Yamada ............... H01L 31/048
136/251
2007/0166526 A1* 7/2007 Myard .................... B32B 5/18
428/304.4
(Continued)

FOREIGN PATENT DOCUMENTS

DE 3520424 12/1986
DE 3520424 A1 * 12/1986 ........... H01L 31/048
(Continued)

OTHER PUBLICATIONS

Abstract of DE 3520424, Telefunken Electronic GMBH, Dec. 11, 1986, 2 pages.*
(Continued)

*Primary Examiner* — Hai Vo
(74) *Attorney, Agent, or Firm* — EcoTech Law Group P.C.

(57) ABSTRACT

A solar cell supporting layer stack for mechanically supporting a solar cell is described. The solar cell includes: a rigid foam layer; one or more skin layers disposed adjacent to said rigid foam layer; and wherein said rigid foam layer and said one or more skin layers capable of providing mechanical support to said solar cell when said supporting layer stack is disposed adjacent to said solar cell.

11 Claims, 7 Drawing Sheets

(51) Int. Cl.
  *B32B 7/12*      (2006.01)
  *B32B 15/04*     (2006.01)
  *B32B 15/20*     (2006.01)
  *B32B 15/18*     (2006.01)
  *B32B 27/06*     (2006.01)
  *H01L 31/048*    (2014.01)
  *H01L 31/049*    (2014.01)

(52) U.S. Cl.
  CPC ............ *B32B 15/20* (2013.01); *B32B 27/065* (2013.01); *H01L 31/049* (2014.12); *H01L 31/0481* (2013.01); *H01L 31/18* (2013.01); *H02S 20/00* (2013.01); *B32B 2262/101* (2013.01); *B32B 2266/0264* (2013.01); *B32B 2266/08* (2013.01); *B32B 2457/12* (2013.01); *Y02E 10/50* (2013.01)

(56) References Cited

U.S. PATENT DOCUMENTS

| | | |
|---|---|---|
| 2009/0272436 A1 | 11/2009 | Cheung |
| 2011/0017268 A1 | 1/2011 | Shembel et al. |
| 2011/0277821 A1 | 11/2011 | Cheng |
| 2011/0297221 A1* | 12/2011 | Jeong .................. H01L 31/048 136/256 |
| 2012/0237759 A1* | 9/2012 | Ehbing ..................... B32B 5/18 428/319.3 |
| 2012/0260587 A1* | 10/2012 | Pini ..................... F24J 2/0444 52/173.3 |
| 2012/0298657 A1* | 11/2012 | Wessels ............... B65D 88/121 220/1.5 |

FOREIGN PATENT DOCUMENTS

| | | | | |
|---|---|---|---|---|
| DE | WO 2011039298 A1 * | 4/2011 | ............... | B32B 5/18 |
| EP | 2305746 | 4/2011 | | |
| JP | 2006-253264 | 9/2006 | | |
| JP | 2007/088892 | 8/2007 | | |
| JP | 2010-278256 | 12/2010 | | |
| KR | 2012-0089038 | 8/2010 | | |
| NL | WO 2011070147 A1 * | 6/2011 | ........... | B65D 88/121 |
| WO | WO 2010-087684 * | 8/2010 | | |
| WO | 2010-148924 | 12/2010 | | |
| WO | 2011/039299 A2 | 4/2011 | | |
| WO | 2011/039299 A3 | 4/2011 | | |
| WO | WO 2011/039297 | 4/2011 | | |
| WO | WO 2011/039299 | 4/2011 | | |
| WO | 2012/120489 | 9/2012 | | |

OTHER PUBLICATIONS

Extended European search report, supplementary European search report and European search opinion, EP Application No. 12848869.9, dated Sep. 22, 2015.

Thomas G. Hood, PCT Application PCT/ PCT/US2012/059836, Int'l Filing Date: Oct. 12, 2012, PCT Search Report dated Mar. 23, 2013.

Thomas G. Hood, PCT Application PCT/ PCT/US2012/059836, Int'l Filing Date: Oct. 12, 2012, Written Opinion dated Mar. 23, 2013.

Thomas G. Hood, PCT Application PCT/ PCT/US2012/059836, Int'l Filing Date: Oct. 12, 2012, IPER dated May 20, 2014.

Applicant: Giga Solar FPC, Application entitled "Novel Solar Modules, Supporting Layer Stacks and Methods of Fabricating Thereof", JP Application No. 2014-542312, Int'l Filing Date Oct. 12, 2012; Japanese Office dated May 31, 2016.

* cited by examiner

SOLAR MODULES, SUPPORTING LAYER STACKS AND METHODS OF FABRICATING THEREOF

RELATED APPLICATION

The application claims priority from U.S. Provisional Application having Ser. No. 61/561,337, filed on Nov. 18, 2011, which is incorporated herein by reference for all purposes.

FIELD OF THE INVENTION

The present invention relates generally to novel solar modules, supporting layer stacks and methods of fabricating thereof. More particularly, the present invention relates to novel solar modules, supporting layer stacks and methods of fabricating thereof that employ a rigid, mechanically-supportive foam layer and at least one skin layer.

BACKGROUND OF THE INVENTION

Conventional solar modules are typically made from materials that are stacked and bonded together to form a support assembly. The support assembly encloses one or more solar cells, which are the electricity-generating component disposed within the solar module. In this configuration, the support assembly serves to both protect the solar cells from damaging environmental elements and facilitate the process of converting solar energy into electricity.

FIG. 1 shows an exploded side-sectional view of a conventional solar module 10, including a cover sheet 12 made from glass. Next to glass cover sheet 12, encapsulants 14 and 18 are provided to encapsulate both sides of a solar cell 16 (e.g., made from either polycrystalline or monocrystalline silicon) to form a "sandwich-like" structure. Adjacent to encapsulant 18, a backsheet is disposed. Backsheet consists of single or multiple layers and performs multiple functions to ensure the longevity and the safety of the solar module. FIG. 1 shows one such backsheet design which includes a polymeric dielectric layer 20 and a polymeric back film 24, which are bonded together by a laminating adhesive 22. Polymeric back film 24 offers protection against moisture, UV, and mechanical damage. Dielectric layer 20 electrically isolates the external portion of solar module 10 from solar cell 16 so that installers, transport personnel, maintenance personnel and fire fighters, who have access to the solar module are not subject to electric shock. This safety feature is particularly important for personnel who are in contact with the solar modules in high voltage systems. Solar module 10 is typically surrounded by an aluminum frame (not shown to simplify illustration) that provides structural integrity, protects the edges of glass cover sheet 12, and provides a convenient attachment point for installation and electrical grounding of the module. In solar module 10, layers 12, 14, 18, 20, 22 and 24, which are disposed between solar cell 16 and an aluminum frame, collectively make up the support assembly.

In the conventional module assembly, glass is a desirable material for cover sheet 12 because it cost-effectively provides structural support to the solar module, protects the solar cells from damage during transportation, installation and use, and also protects the solar cells from environmental elements, such as moisture, snow, hail and wind-borne debris. Additionally, the highly transparent nature of glass allows solar energy to pass through to and impinge upon the solar cells, generating electricity. To maximize and effectively harness solar energy, encapsulants 14 and 18 are substantially transparent to solar wavelengths and are typically made from a polymeric adhesive that bonds the module together. The configuration and various components of solar module 10, as presented in FIG. 1 and discussed above, have not changed since the inception of the solar module design.

Unfortunately, conventional solar modules are heavy for the surface area required and the electrical power obtained, and therefore, suffer from several drawbacks. By way of example, weight and dimensions of the conventional module make its manufacturing, packaging, transportation, installation and support difficult and expensive. The total weight of a conventional solar module and its aluminum frame is between about 18 kg and about 21 kg. Depending on its size and thickness, the glass cover sheet (which typically weighs between about 12 kg and about 15 kg per module) accounts for majority of the module's weight. Moreover, the thickness of a solar module with an aluminum frame is about 55 mm. Furthermore, the fragile nature of the glass cover sheet requires the entire solar module to be securely packaged, adding to the packaging weight and cost.

With respect to shipping, the weight and thickness of the conventional solar modules limit the quantity of modules that may be shipped in a fixed volume of a shipping container. As a result, where a large number of modules are required, there is an increase in the number of shipments, which in turn increases shipping costs. These shipping costs are further exacerbated when installations are conducted in rural destinations or where there is an inadequate transportation infrastructure.

With respect to installation, the weight and size of the conventional module increase the installation costs for residential, commercial and utility-scale applications. A solar module is typically installed on the rooftop of a building or ground structure. Before installation, each module is lifted to a building's roof top and then placed in a desired location. To handle the relatively heavy and large modules, such pre-installation activities require two or more installers for lifting, maneuvering and placing. In some instances, not too uncommon, additional means (e.g., a crane or lift) for lifting modules are necessary that add to the installation costs.

The weight of the module also increases the cost of installation because installation requires a sound structural support system (also referred to as "support mounts"). During the installation process, support mounts are used to rigidly or firmly connect the solar module to a building or a stand-alone facility. Furthermore, support mounts keep the solar module aligned with the sun and prevent the module from being damaged during inclement weather, such as during high winds or heavy snow fall. Even in the absence of harsh weather elements, the heavy solar modules itself places a significant load on the roof and on the support mounts. As a result, the support mounts are designed to firmly secure the modules and withstand the additional load realized from high winds, earthquakes and/or heavy snow fall. To this end, local, state and federal building codes and engineering standards typically regulate the support mounts employed to ensure that they are safe and will perform as intended. A heavier solar module typically requires stronger support mounts that are relatively more expensive to design, build and install.

What are, therefore, needed are novel designs of solar modules and methods of making thereof that do not suffer from the drawbacks encountered by the heavy conventional solar module designs.

SUMMARY OF THE INVENTION

In view of the foregoing, the present invention provides novel solar cell supporting layer stack designs, solar module designs and processes for making thereof. In one aspect, the present invention provides a solar cell supporting layer stack for mechanically supporting a solar cell. The supporting layer stack includes: (i) a rigid foam layer; and (ii) one or more skin layers disposed adjacent to the rigid foam layer; and (iii) wherein the rigid foam layer and one or more of the skin layers are capable of providing mechanical support to the solar cell when the supporting layer stack is disposed adjacent to the solar cell.

In one embodiment of the inventive supporting layer stacks, the rigid foam layer is sandwiched between two of one or more of the skin layers, wherein one of the skin layers is disposed between the rigid foam layer and the solar cell when the supporting stack layer is disposed adjacent to the solar cell. The supporting layer stack may include an adhesive layer disposed between one or more of the skin layers and the rigid foam layer. The rigid foam layer is preferably made from at least one material selected from a group consisting of polyethylene terephthalate, polyurethane, polyetherimide, polymethacrylimide, styreneacrylonitrile, polyimide, polyvinylchloride, polyvinylidene fluoride, polycarbonate, ethylene vinyl acetate, balsa wood, polyisocyanurate, polyethylene, carbon, aluminum, polyethylene naphthalate, polyolefin and polypropylene. In a more preferred embodiment of the present invention, the rigid foam core may be made from polyethylene terephthalate. The foam layer may have a thickness that is between about 3 mm and about 25 mm. In accordance with one embodiment of the present invention, the foam layer has a density that is between about 25 kg/m$^3$ and about 300 kg/m$^3$.

In certain embodiments of the present invention, the rigid foam layer may have sufficient load bearing properties to support to the solar cells. By way of example, the foam layer has a compression strength that is between about 0.6 MPa and about 7.5 MPa. As another example, the foam layer has a compression modulus that is between about 40 MPa and 400 MPa. As yet another example, the foam layer has a shear strength that is between about 0.4 MPa and 4.5 MPa. As yet another example, the foam layer has a shear modulus that is between about 10 MPa and about 100 MPa.

The above-mentioned one or more skin layers are preferably made from at least one material selected from a group consisting of polyvinyl fluoride, polymer of tetrafluoroethylene, hexafluoropropylene fluoride, vinylidene fluoride, polyvinylidene fluoride, tetrafluoroethylene co-polymer, ethylene chlorotrifluoroethylene, polyethylene terephthalate, polyethylene naphthalate, polyamide-12; polyamide-11, polymethyl methacralate, polycarbonate, polybutylene terephthalate, aluminum, stainless steel, galvanized steel, titanium, copper, molybdenum, polyethylene resin with glass fiber and polypropylene resin with glass fiber. In a more preferred embodiment of the present invention, however, one or more of the skin layers are made from aluminum. In an alternate more preferred embodiment of the present invention, one or more of the skin layers are made from stainless steel.

In one embodiment of the present invention, one or more of the skin layers have a thickness that is between about 0.025 mm and about 3.0 mm. Preferably, at least one of the one or more skin layers is an insulating layer that electrically isolates the supporting layer stack from the solar cell when the supporting layer stack is disposed adjacent to the solar cell. At least one of the one or more skin layers may be resistant to solar UV energy. Furthermore, at least one of the one or more skin layers may have a vapor transmission rate of less than 0.05 GM/m$^2$/day.

The inventive supporting stack layers may include an adhesive layer disposed between one or more of the skin layers and the rigid foam core. In an alternate embodiment of the present invention, however, the foam layer may be fused with one or more of the skin layers to form the supporting layer stack without using an adhesive.

In another aspect, the present invention provides a solar module. The solar module includes: (i) a solar cell; and (ii) a solar cell supporting layer stack adjacent to and mechanically supporting the solar cell. In this aspect, the solar cell supporting layer stack includes: (i) a rigid foam layer; and (ii) one or more skin layers disposed adjacent to the rigid foam layer; and (iii) wherein the rigid foam layer and one or more skin layers are capable of providing mechanical support to the solar cell when the supporting layer stack is disposed adjacent to the solar cell.

The inventive solar modules may have a width that is between about 0.5 m and about 3 m, may have a length that is between about 0.5 m and about 3 m, and have thickness that is between about 4 mm and about 25 mm. The solar module of the present invention may weigh between about 4 kg and about 10 kg.

The solar cell, present inside the solar modules, preferably includes at least one material selected from a group consisting of polycrystalline silicon, monocrystalline silicon, cadmium telluride, copper indium gallium diselinide, amorphous single junction silicon, amorphous and polycrystalline double junction silicone, crystalline silicon, gallium arsenide and copper zinc tin sulfide.

In yet another aspect, the present invention provides a process for fabricating a solar cell supporting stack. The process comprises: (i) obtaining a rigid foam layer; (ii) obtaining one or more skin layers to be disposed adjacent to the rigid foam layer, wherein the rigid foam layer and one or more skin layers are capable of providing mechanical support to the solar cell when the supporting layer stack is disposed adjacent to the solar cell; and (iii) applying adhesive between the rigid foam layer and one or more of the skin layers to form the solar cell supporting layer stack.

The adhesive applied between the rigid foam layer and one or more of the skin layers preferably includes one material selected from a group consisting of ethylene vinyl acetate, polyurethane, silicone, polyvinyl butyral, polyolefin, ionomer, epoxies, butyl rubber-based adhesives and vinyl-phenolic.

In yet another aspect, the present invention provides another process of fabricating a solar cell supporting layer stack. The process of fabricating the alternate supporting layer stack includes: (i) obtaining a rigid foam layer; (ii) obtaining one or more skin layers to be disposed adjacent to the rigid foam layer, wherein the rigid foam layer and the one or more skin layers capable of providing mechanical support to the solar cell when the supporting layer stack is disposed adjacent to the solar cell; and (iii) heating the rigid foam layer and one or more of the skin layers to or substantially near a melting point of the rigid foam layer or at least one of the one or more skin layers to form a heated rigid foam layer and one or more heated skin layers; and applying pressure to bond the heated rigid foam layer and one or more heated skin layers and form the solar cell supporting layer stack.

In accordance with one embodiment of the present invention, the melting point of the form layer is between about 160° C. and about 275° C. The melting point of one or more of the skin layers may be between about 200° C. and about 240° C. The heating includes providing heat treatment using at least one of a conventional thermal oven in conjunction with a vacuum bag, an infrared oven accompanied by pinch rollers, a microwave oven press, a flame treatment, heated pinch rollers, hydraulic and heated press, autoclave, heated vacuum bag and a flatbed laminator with both continuous and heated metal belts. The pressure applied to bond the heated rigid foam layer and one or more heated skin layers is preferably between about 10 lbs/in$^2$ and about 50 lbs/in$^2$. In one embodiment, the inventive processes apply pressure for a duration that is less than 15 minutes. Inventive processes of fabricating the supporting layer stack may further include cooling the solar cell supporting layer stack, after applying pressure, to form a cooled solar cell supporting layer stack. Cooling, as contemplated by one embodiment of the present invention, may have a duration that is less than 15 minutes.

In yet another aspect, the present invention provides a process of fabricating a solar module. The process of fabricating a solar module includes: (i) obtaining a solar cell; (ii) obtaining a solar cell supporting layer stack to be disposed adjacent to the solar cell, and the supporting layer stack includes: (a) a rigid foam layer; (b) one or more skin layers disposed adjacent to the rigid foam layer; and (c) wherein the rigid foam layer and one or more of the skin layers are capable of providing mechanical support to the solar cell when the supporting layer stack is disposed adjacent to the solar cell; and (iii) applying adhesive between the solar cell and the solar cell supporting layer stack to form the solar module.

The construction and method of operation of the invention, however, together with additional objects and advantages thereof, will be best understood from the following descriptions of specific embodiments when read in connection with the accompanying figures.

DETAILED DESCRIPTION OF THE PREFERRED EMBODIMENTS

In the following description, numerous specific details are set forth in order to provide a thorough understanding of the present invention. It will be apparent, however, to one skilled in the art that the present invention may be practiced without limitation to some or all of these specific details. In other instances, well-known process steps have not been described in detail in order to not unnecessarily obscure the invention.

The present invention recognizes that a solar cell supporting layer stack that does not include glass cover sheet overcomes the drawbacks encountered by the conventional solar module design. In accordance with one embodiment of the present invention, the supporting layer stack includes a cover sheet not made from glass, which, in conventional assemblies, is designed to resist environmental elements, such as UV radiation, moisture, snow, hail and wind-borne debris. In a preferred embodiment, the inventive supporting layer stacks includes any rigid layer adjacent or approximate to an appropriate skin layer. In a more preferred embodiment, however, inventive rigid layer consists of a foam layer.

It is noteworthy that the term "adjacent," as used herein, is not limited to embodiments where the different layers characterized as "adjacent" and disposed inside the solar module or the solar cell supporting layer stack, contact each other. Rather, the use of the term "adjacent" also covers those embodiments where one or more intermediate layers are interposed between two "adjacent" layers.

Figure 1:
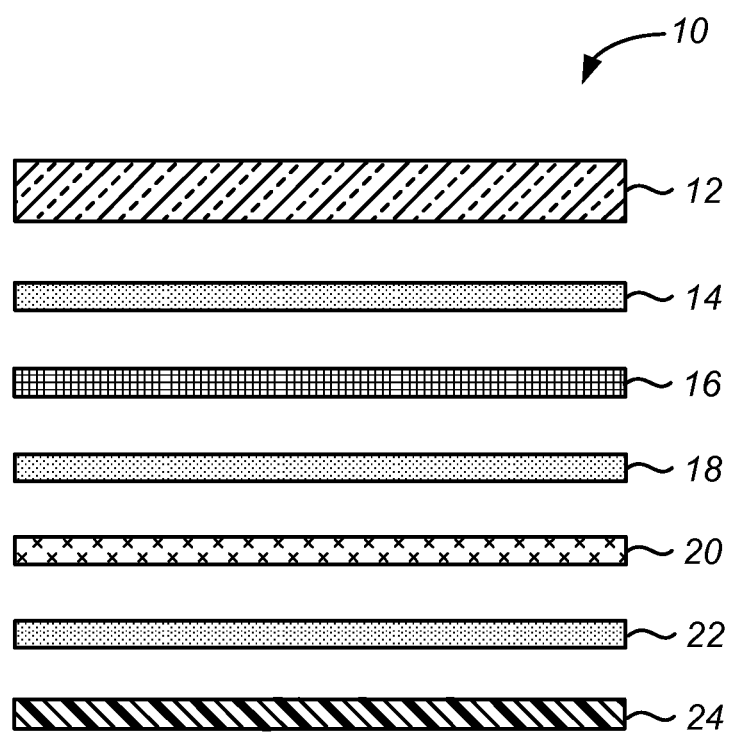
FIG. 1 is an exploded side-sectional view of a conventional solar module.
Figure 2:
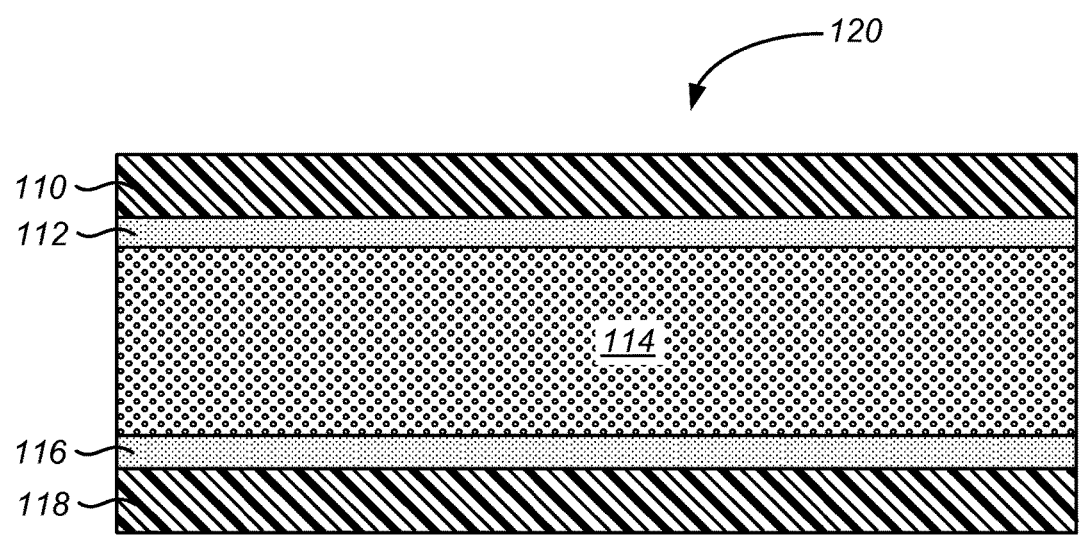
FIG. 2 shows a side-sectional view of a solar cell supporting layer stack, according to one embodiment of the present invention.

FIG. 2 shows an exemplar inventive supporting layer stack 120 that attaches to one or more solar cells, typically by an adhesive layer. Supporting layer stack 120 includes a closed-cell, rigid foam layer 114, which does not absorb moistures, sandwiched between two skin layers 110 and 118 using interposed adhesive layers 112 and 116. Foam layer 114 provides mechanical support to the solar cells when supporting layer 120 is assembled with the solar cell within a solar module. Examples of mechanical properties of foam layer 114 includes shear strength, shear modulus, shear elongation, compressive strength, compressive modulus, impact toughness (i.e., resilience), and fatigue resistance.

Skin layers 110 and 118 may provide tensile strength, tensile modulus, compressive strength, compressive modulus, along with other key environmentally-protective properties for the foam component and the solar module overall. Skin layer 110 may act as a dielectric layer, which electrically isolates the solar cells from components external to skin layer 110 within the solar module. Skin layer 118 preferably offers protection to foam layer 114 and the solar cells from environmental elements, such as moisture, UV radiation, snow, hail and wind-borne debris.

Adhesive layers 112 and 116 are preferably able to withstand the shear and tensile forces between the skins and core, as well as perform the essential role of bonding these elements together for the life of the solar module.

Figure 3:
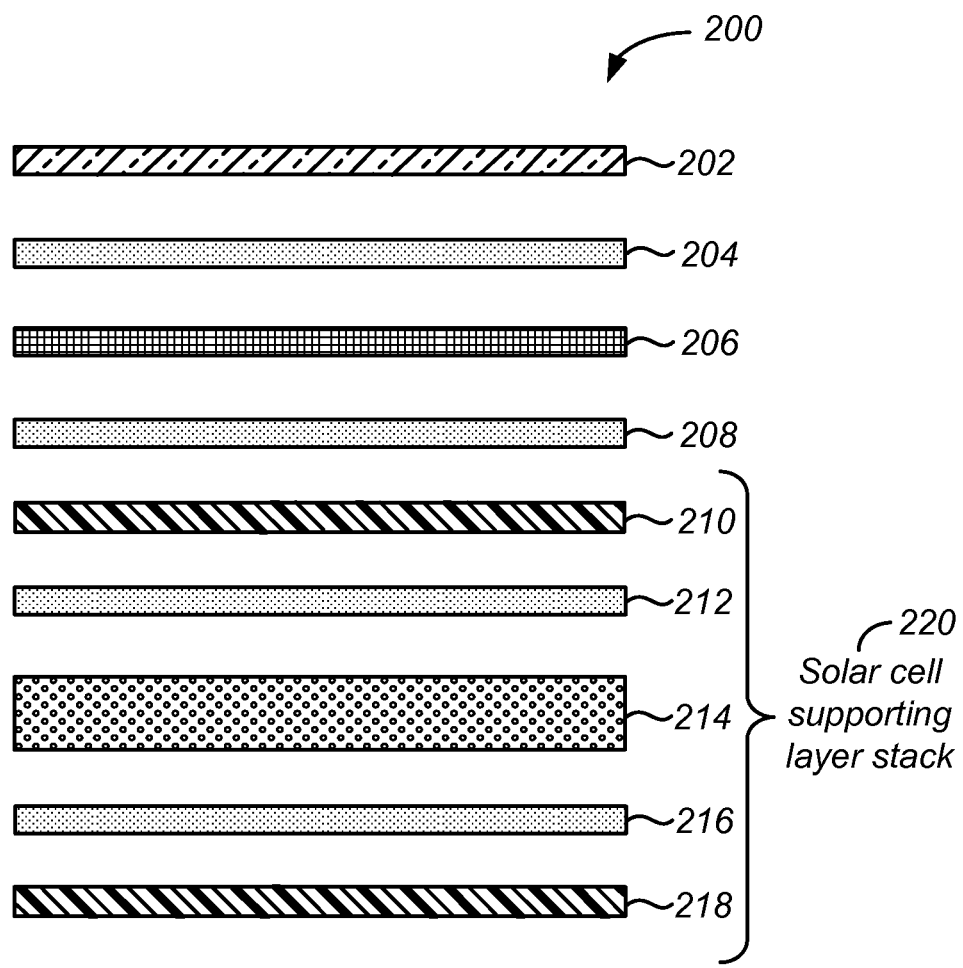
FIG. 3 shows an exploded side-sectional view of a solar module, according to one embodiment of the present invention, including an exemplar inventive solar cell supporting layer stack shown in FIG. 2.

FIG. 3 shows a solar module 200, according to one embodiment of the present invention. Solar module 200 incorporates a supporting layer stack 220 substantially similar to supporting layer stack 120 shown in FIG. 2. Solar module 200 includes a cover film 202 and solar cells 206, which adhere to each other by an interposed adhesive layer 204. The sub-assembly of cover film 202, adhesive layer 204 and solar cells 206 adhere to a supporting layer stack 220 by another adhesive layer 208. In this configuration, it is noteworthy that adhesive layers 204 and 208 sandwich solar cells 206. In preferred embodiments of the present invention, adhesive layers 204 and 208 encapsulate solar cells 206, and are therefore commonly referred to as "encapsulants." Encapsulants 204 and 208, as they are sometimes known, offer additional protection to the solar cell from external forces acting on the solar module. Adjacent to encapsulant 208, supporting layer stack as described in FIG. 2 is disposed. In the embodiment shown in FIG. 3, supporting layer stack 220 includes two skin layers 210 and 218, sandwiching a foam layer 214. Adhesives 212 and 216 interposed between skin layer 210 and foam layer 214 and between foam layer 214 and skin layer 218, respectively, hold the supporting layer stack sub-assembly 220 together during the lifetime and operation of the solar module 200.

Figure 4:
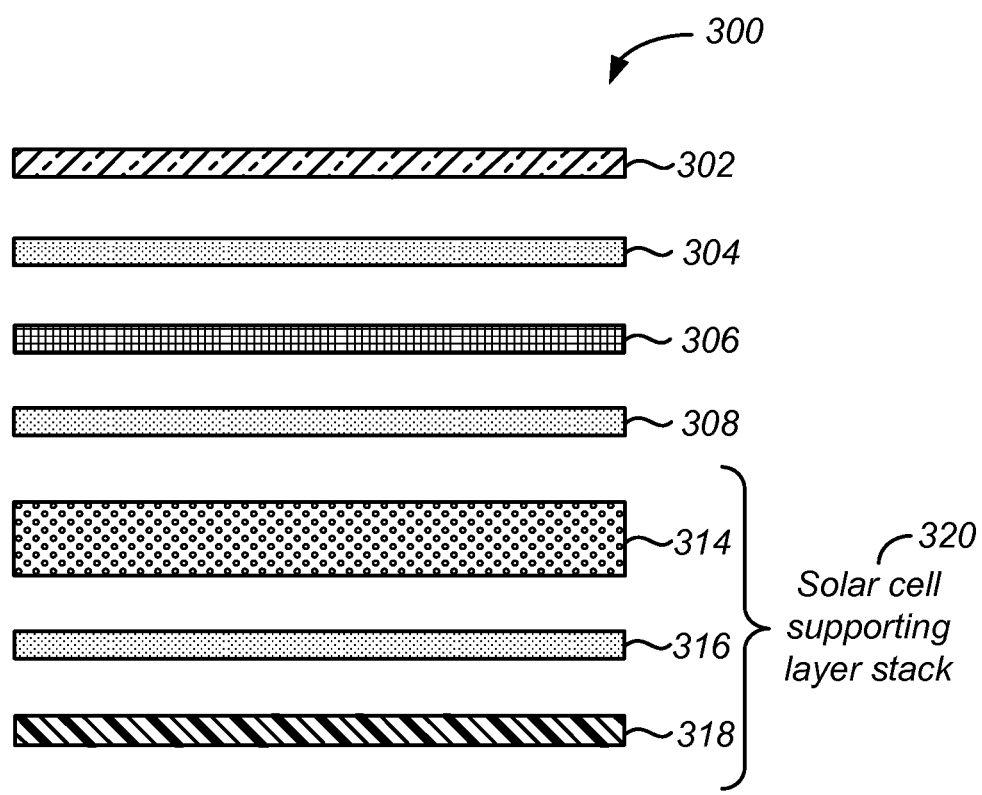
FIG. 4 shows an exploded side-sectional view of a solar module, according to another embodiment of the present invention, including another exemplar inventive supporting layer stack that has a rigid foam layer adhering to a single skin layer using an interposed adhesive layer.

In certain preferred embodiments of the present invention, it is not necessary to have two or more skin layers, as shown in FIGS. 2 and 3, in the inventive supporting layer stack sub-assemblies. FIG. 4 shows a solar module 300, according to another embodiment of the present invention, including a supporting layer stack that has a single skin layer.

Solar module 300 includes a cover film 302, encapsulants 304 and 308 and solar cells 306 that are the same or substantially similar to their counterparts shown in FIG. 3, i.e., cover film 202, encapsulants 204 and 208, and solar cells 206. Furthermore, skin layer 318, adhesive layer 316 and foam layer 314 are also same or substantially similar to their counterparts shown in FIG. 3, i.e., skin layer 318, adhesive layer 316 and foam layer 314. It is noteworthy that in the embodiment shown in FIG. 4, layers corresponding to skin layer 210 and adhesive layer 212 are absent. The absence of a skin layer and an associated adhesive layer provides inventive supporting layer stacks that enjoy the advantages of reduced weight and lower manufacturing cost for the ultimately produced solar module 300.

Figure 5:
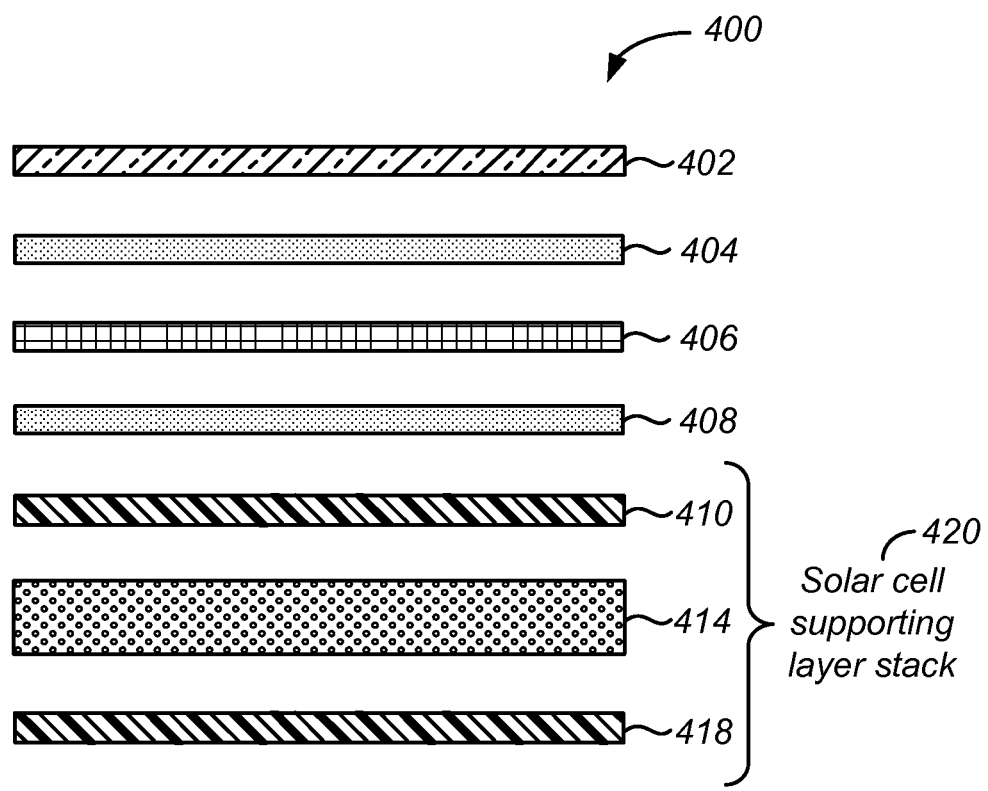
FIG. 5 shows an exploded side-sectional view of a solar module, according to yet another embodiment of the present invention, including a yet another exemplar inventive supporting layer stack that has a rigid foam layer sandwiched between two skin layers without interposed adhesive layers.

It is also important to note, however, that in certain preferred embodiments of the present invention, the presence of adhesive layers (e.g., adhesive layers 212 and 216 of FIG. 3) is not necessary to hold the inventive supporting layer stack sub-assemblies together. To this end, FIG. 5 shows a solar module 400, according to an alternate embodiment of the present invention, including a foam layer 414 that is directly sandwiched between skin layers 410 and 418, without using any adhesive layer. In all other respects, solar module 400 of FIG. 5 is substantially similar to solar module 200 in FIG. 3. In other words, a cover film 402, encapsulants 404 and 408, solar cells 406 are the same or substantially similar to their counterparts cover film 202, encapsulants 204 and 208, solar cells 206 of FIG. 3.

In the absence of adhesive layers, a resulting supporting layer stack 420 of FIG. 5 is relatively light weight, inexpensive to manufacture and requires a reduced list of materials during the supporting layer stack or solar module manufacturing process. In those applications where high strength of bonding between the different layers within supporting layer stacks is required, supporting layer stack 120 may represent a preferred embodiment of the present invention.

Foam layer (e.g., 114 of FIG. 2, 214 of FIG. 3, 314 of FIG. 4, 414 of FIG. 5) as contemplated by the present invention, need not be made from foam, and may well be made from any suitable rigid, lightweight material that is capable of offering mechanical support to solar cells within a solar module. Foam layer, however, is preferably made from at least one material selected from a group consisting of polyethylene terephthalate, polyurethane, polyetherimide, polymethacrylimide, styreneacrylonitrile, polyimide, polyvinylchloride, polyvinylidene fluoride, polycarbonate, ethylene vinyl acetate, balsa wood, polyisocyanurate, polyethylene, carbon, aluminum, polyethylene naphthalate, polyolefin and polypropylene.

Foam layer inside inventive supporting layer stacks may be of a suitable thickness that provides the requisite mechanical support to solar cells within a solar module. In accordance with one embodiment of the present invention, thickness of foam layer inside inventive supporting layer stacks is between about 3 mm and about 25 mm. In one example, the foam layer's thickness is between about 1 mm and about 5 mm. In preferred embodiments of the present invention, however, the foam layer's thickness is about 4 mm and about 12 mm. Similarly, in a more preferred embodiment of the present invention, foam layer's thickness is between about 5 mm and about 10 mm.

The density of foam layer in inventive supporting layer stacks may be any value that provides the solar module with the requisite strength to withstand any undue external force. The foam layer density may be a value that is between about 25 kg/m$^3$ and about 300 kg/m$^3$, is more preferably a value between about 75 kg/m$^3$ and about 250 kg/m3, and is most preferably a value that is between about 100 kg/m$^3$ and about 200 kg/m$^3$.

In certain embodiments of the present invention, it is desirable to have a foam layer that has sufficient load bearing properties that it can provide the rigidity and shear strength needed to address the static and dynamic forces that the solar module will see in application. To this end, a measurement of compression strength value of a foam layer in the inventive supporting layer stacks may be deemed relevant by those skilled in the art. In those instances when this value is so deemed, compression strength value of the inventive foam layers is preferably between about 0.6 MPa and about 7.5 MPa, is more preferably between about 1.0 MPa and about 3.5 MPa, and is most preferably between about 1.4 MPa and about 2.5 MPa. In other instances, those skilled in the art may deem a compression modulus value as an important measure of foam layer strength. In such instances, a compression modulus value of the inventive foam layers is between about 40 MPa and about 400 MPa, is preferably between about 75 MPa and about 200 MPa, and is more preferably between about 100 MPa and about 180 MPa.

With respect to a shear strength value for the inventive foam layers, an acceptable range is between about 0.4 MPa and about 4.5 MPa. Preferably, however, the shear strength value is between about 0.6 MPa and about 3.0 MPa, and more preferably is between about 0.8 MPA and about 1.6 MPa. To the extent a shear modulus value or a shear strength value associated with the inventive foam layers is deemed relevant, the present invention contemplates a relatively wide range of measurements. By way of example, a shear modulus value for the inventive foam layers is between about 10 MPa and about 100 MPa, is preferably between about 20 MPa and about 75 MPa, and is more preferably between about 30 MPa and about 60 MPa.

Skin layer, in addition to or instead of providing mechanical strength to the supporting layer stack, may serve to provide the solar cell protection from environmental elements. In certain other embodiments of the present invention, the skin layer provides dielectric strength to the supporting layer stack sub-assembly. Representative materials used for making a skin layer includes at least one material selected from a group consisting of polyvinyl fluoride, polymer of tetrafluoroethylene, hexafluoropropylene fluoride, vinylidene fluoride, polyvinylidene fluoride, tetrafluoroethylene co-polymer, ethylene chlorotrifluoroethylene, polyethylene terephthalate, polyethylene naphthalate, polyamide-12, polyamide-11, polymethyl methacralate, polycarbonate, polybutylene terephthalate, aluminum, stainless steel, galvanized steel, titanium, copper, molybdenum, polyethylene resin with glass fiber and polypropylene resin with glass fiber.

In the inventive supporting layer stacks, a skin layer having different physical or chemical properties offers protection from a wide range of environmental elements. Examples of important properties include: mechanical strength, UV resistance, thermal stability, hydrolytic stability, flammability, oxygen transmission rate and moisture vapor transmission rate. In addition to a foam layer of appropriate thickness, an appropriately thick skin layer also contributes to the mechanical strength of the inventive supporting layer stacks, which support solar cells within the solar module. The thickness of one or more skin layers, in accordance with one embodiment of the present invention, in the inventive supporting layer stacks is between about 0.025 mm and about 3.0 mm, is preferably between about 0.100 mm and about 1.0 mm, and is most preferably between about 0.175 mm and about 0.500 mm.

Prolonged exposure to UV radiation degrades polymer physical and optical properties. Consequently, it is desirable that the inventive supporting layer stacks maintain and provide resistance to such radiation. To this end, one or more skin layers in the inventive supporting layer stacks preferably are 100% opaque to UV radiation between 300 and 400 nm wavelengths, and maintain no less than 80% of their original mechanical and optical properties after 10,000 hours of exposure to 0.35 Watt/m$^2$ of UV radiation at temperatures between 42° C. and 63° C. with an intermittent water spray. Permeating moisture vapor through the skin layer can impact the performance and lifetime of the solar cell, foam and encapsulant and is preferably reduced to a level that allows for long lifetimes and high performance of the materials used throughout the solar module. A value for moisture vapor transmission resistance of a skin layer in the inventive supporting layer stacks of the present invention may be less than about 0.05 gm/m$^2$/day, is more preferably a value less than about 0.005 gm/m$^2$/day, and is most preferred a value less than about 0.0005 gm/m$^2$/day.

In those embodiments where one or more skin layers provide dielectric strength to a supporting layer stack subassembly, a dielectric strength of each skin layer is sufficiently high to result in a partial discharge voltage level that is between about 750 volts and about 1,200 volts. In one preferred embodiment of the present invention, one skin layer, which includes aluminum or another electrically conductive metal, is disposed farthest from the solar cells (e.g., skin layer 118 of FIG. 2) and designed to offer protection from the environmental elements. In this embodiment, another skin layer, which includes polyester and metal, is disposed proximate to the solar cells (e.g., skin layer 110 of FIG. 2) to offer the requisite dielectric strength.

In those embodiments (e.g., FIGS. 2, 3 and 4) of the inventive supporting layer stacks where an adhesive layer (e.g., adhesive layers 112 and 116 of FIG. 2) is disposed between the foam layer and one or more skin layers to bond the two layers, the adhesive layer may include any effective adhesive that effectively performs the bonding function. In one embodiment of the present invention, an adhesive layer includes a material selected from a group consisting of ethylene vinyl acetate, polyurethane, silicone, polyvinyl butyral, polyolefin, ionomer, epoxy, butyl rubber-based adhesive and vinyl-phenolic. Such adhesive layers may in some instances include filler materials that provide strength to the layer. Such filler materials include, for example, glass spheres, silica and nanocrystalline cellulose.

Inventive supporting layer stacks are not limited to use with any particular type of solar cell. Rather, inventive supporting layer stacks may be employed with a wide variety of solar cells in a solar module. Representative solar cells include polycrystalline silicon, monocrystalline silicon, cadmium telluride, copper indium gallium diselenide, amorphous single junction silicon, amorphous and polycrystalline double junction silicone, crystalline silicon, gallium arsenide and copper zinc tin sulfide.

Figure 6:
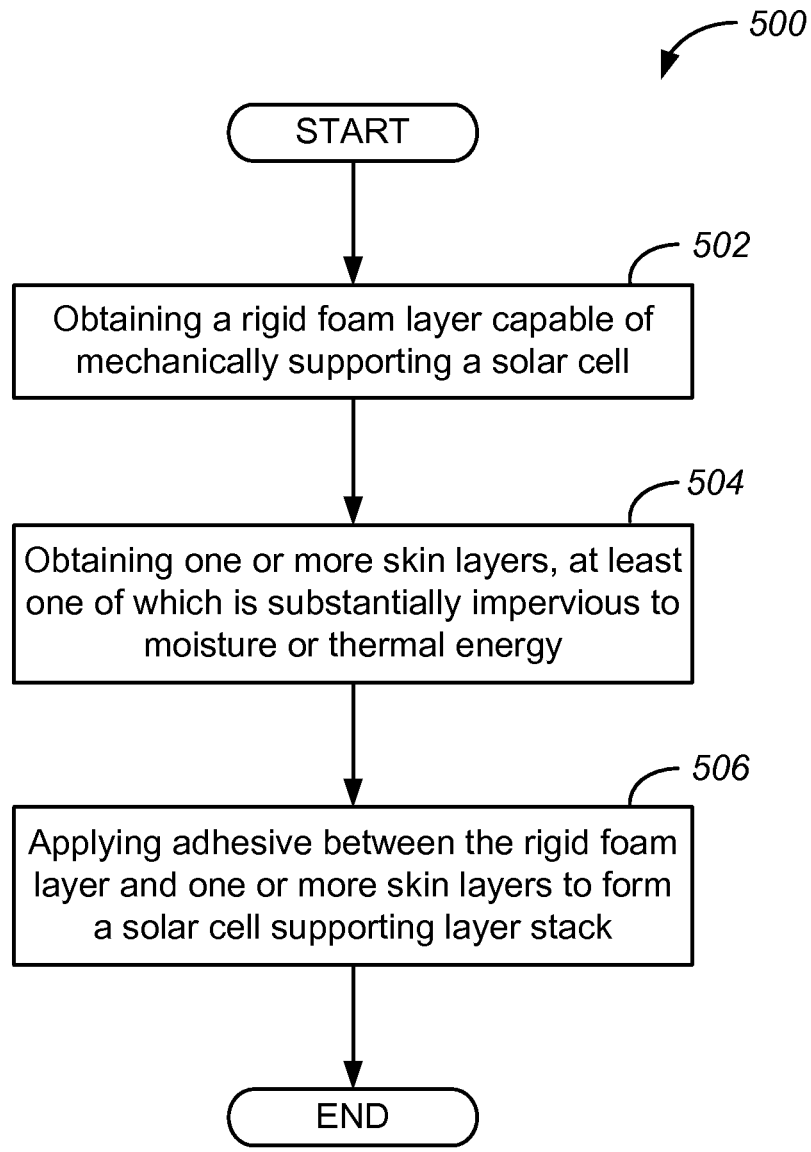
FIG. 6 is a flowchart of a process, according to one embodiment of the present invention, of fabricating inventive solar modules (e.g., those shown in FIGS. 3 and 4).

The present invention also offers novel processes for manufacturing inventive supporting layer stacks and inventive solar modules that incorporate the supporting layer stacks (e.g., one of supporting layer stacks 120 of FIG. 2, 220 of FIG. 3 and 320 of FIG. 4). FIG. 6 shows a flow chart of a process 500, according to one embodiment of the invention, for fabricating a supporting layer stack (e.g., one of supporting layer stacks 120 of FIG. 2, 220 of FIG. 3 and 320 of FIG. 4). Process 500 preferably begins with a step 502, which includes obtaining a rigid foam layer (e.g., one of foam layers 114 of FIG. 2, 214 of FIG. 3 and 314 of FIG. 4). As mentioned above, the foam layer is capable of mechanically supporting one or more solar cells.

Next, a step 504 includes obtaining one or more skin layers (e.g., one of skin layers 110 and 118 of FIGS. 2, 210 and 218 of FIG. 3 and 318 of FIG. 4). Continuing with FIG. 6, an adhesive (e.g., at least one of adhesive layers 112 and 116 of FIG. 2, 212 and 216 of FIG. 3 and 316 of FIG. 4 and that may be in the form of a discrete layer) is applied in a step 506 between the foam layer and one or more of the skin layers to form an inventive layer stack. Although step 504 of FIG. 6 requires at least one skin layer to be substantially impervious to moisture or thermal energy, the present invention is not so limited. A skin layer of the present invention is not limited to any particular property, and may have any one or a combination of the different properties described herein.

Those skilled in the art will recognize that steps 502, 504 and 506 need not be performed in any particular order and that the sequence of steps presented in FIG. 5 is one exemplar sequence of assembling the inventive supporting layer stacks. By way of example, after step 502, step 506 is performed to produce a foam layer with adhesive thereon. Next, step 504 is carried out to affix the skin layer to the foam layer and form an inventive supporting layer stack.

Not only are the inventive processes not limited to a particular sequence, but they are not limited to effecting adhesion by using an adhesive layer as shown in the inventive supporting layer stack of FIG. 5. To this end, the present invention offers a process 600, according to another embodiment of the present invention, for fabricating a supporting layer stack (e.g. supporting layer stack 420 of FIG. 5). Process 600 preferably begins in a step 602, which includes obtaining a rigid foam layer. Step 602 is the same as or substantially similar to step 502 of FIG. 5. Next, process 600 proceeds to a step 604, which includes obtaining one or more skin layers and is the same as or substantially similar to step 504 of FIG. 5.

Then, a step 606 is carried out. Step 606 includes heating the foam layer and/or one or more of the skin layers to or substantially near the melting point of the foam layer or any one of the skin layers to produce a heated foam layer and/or at least one heated skin layer.

In step 606, it does not matter which of the heated layers is melted, so long as any one of them is melted to an extent that permits effective bonding between the foam and the skin layer(s). In one embodiment of the present invention, the foam core and/or one or more skin layers are heated to a temperature that is about 200° C. The foam and/or one or more of the skin layers are, however, preferably heated to about 220° C., and more preferably heated to above about 230° C.

Step 606 is not limited to any particular heat treatment method. In certain preferred embodiments of the present invention, the foam layer and/or one or more of the skin layers is heated by one method selected from the group consisting of a conventional thermal oven in conjunction with a vacuum bag, an infrared oven accompanied by pinch rollers, a microwave oven press, a flame treatment, heated pinch rollers, hydraulic and heated press, autoclave, heated vacuum bag and a flatbed laminator with both continuous and heated metal belts. Process 600 includes a step 608, which involves applying pressure to bond the heated foam layer and one or more of the heated skin layers to form the inventive supporting layer stacks. There is no particular pressure requirement in step 608 so long as bonding of appropriate strength is accomplished. A pressure applied to the heated foam layer and one or more of the heated skin layers is between about 0 lbs/in$^2$ and about 50 lbs/in$^2$, is more preferably between about 12 lbs/in$^2$ and about 40 lbs/in$^2$, and is most preferably between about 15 lbs/in$^2$ and about 30 lbs/in$^2$. At this stage an inventive supporting layer stack similar to the one shown in FIG. 5 is formed. To ensure foam core and one or more skins are fully bonded, however, continuous pressure is preferably applied to the supporting layer stack for a duration of about 10 minutes. Shorter durations of applied pressure may also work well. By of example, durations that range between about 2 minutes to about 5 minutes produce an effectively bonded supporting layer stack.

Figure 7:
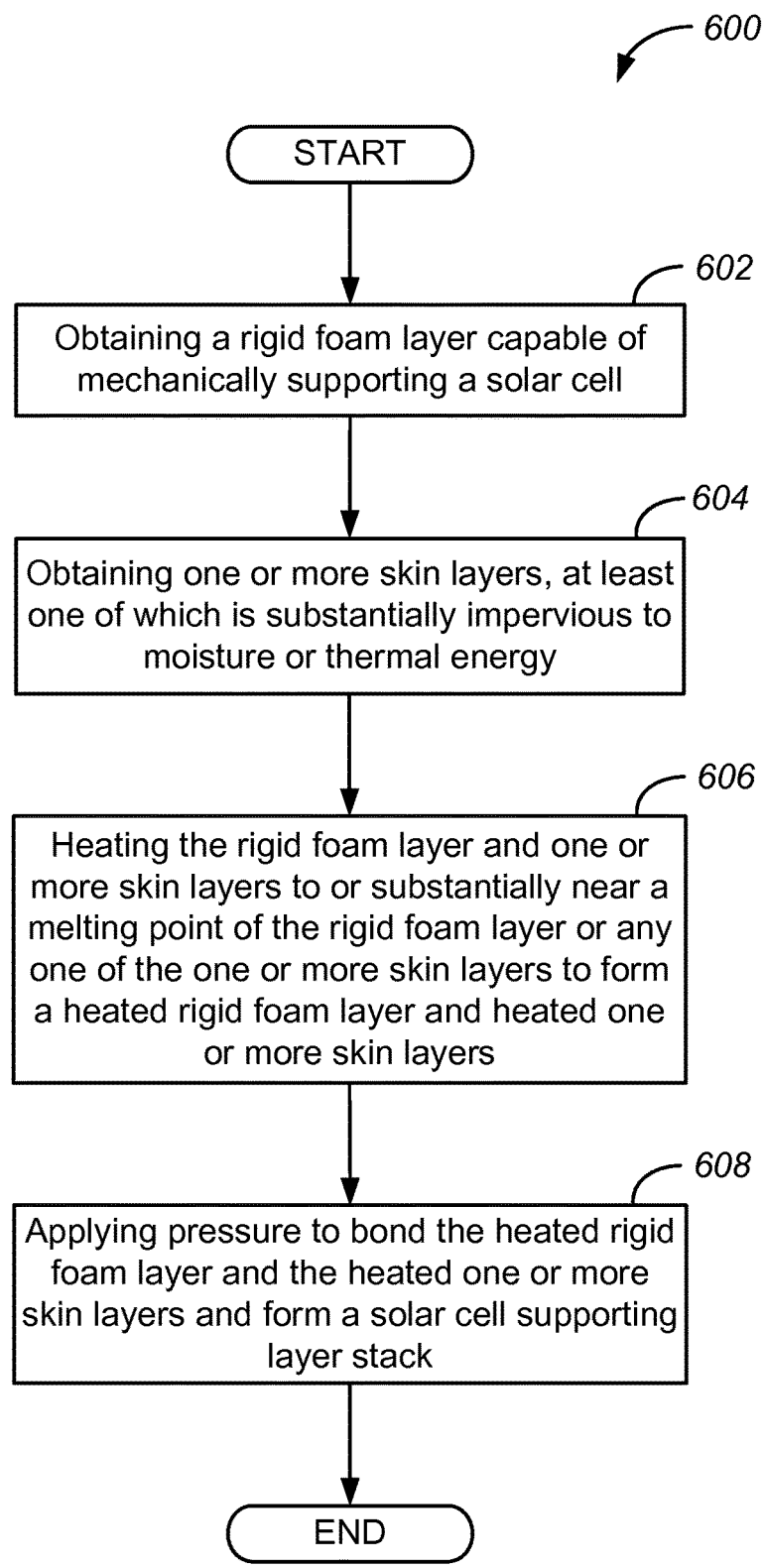
FIG. 7 is a flowchart of a process, according to another embodiment of the present invention, of fabricating another inventive solar module (e.g., the one shown in FIG. 5).

Regardless of which method is used to manufacture the inventive supporting layer stacks, conventional or non-conventional cover sheet and solar cell layers may be added, according to well-known techniques, to the supporting layer stacks of the present invention and form inventive solar modules (e.g., one of solar modules 100 of FIG. 2, 200 of FIG. 3, 300 of FIG. 4 and 400 of FIG. 5). As a result, the present invention also offers inventive solar module fabricating processes which incorporate process 500 or FIG. 6 or process 600 of FIG. 7.

Inventive solar modules and supporting layer stacks and the novel processes for manufacturing thereof offer several advantages over their conventional counterparts. By way of example, by not using a glass cover sheet and significantly reducing the weight of the solar module or the supporting layer stack, the present invention realizes savings in manufacturing, packaging, transportation and installation costs. The total weight of the inventive solar module may be between about 4.0 kg and about 10.0 kg, is preferably between about 4.5 kg and about 7.0 kg and is more preferably between about 5.0 kg and about 6.0 kg. Light weight solar modules also lend themselves to easy transportation. As a result, large quantities of inventive solar modules may be shipped in a fixed volume of a shipping container. Furthermore, light weight inventive solar modules do not place a heavy load on a roof and support mounts.

Substantial cost savings associated with manufacturing, packaging, transportation and installation are also realized by the reduced thickness of the inventive supporting layer stacks. By way of example, a thickness of inventive solar modules may be between about 4 mm and about 25 mm, is more preferably between about 5.0 mm and about 15 mm, and is most preferably between about 6.0 mm and about 10.0 mm.

Moreover, in the absence of glass, inventive designs of solar modules and supporting layer stacks obviate the need for measures taken for fragile handling, including secure packaging, during transportation and installation. Reduced weight and thickness and in the absence of a fragile component of the inventive solar modules all translate into various cost savings, making solar energy a more commercially viable alternative energy solution.

Although illustrative embodiments of this invention have been shown and described, other modifications, changes, and substitutions are intended. By way of example, the present invention discloses heat bonding a foam layer and at least one skin layer without using any adhesive, other conventional layers in the solar module may be similarly bonded. Accordingly, it is appropriate that the appended claims be construed broadly and in a manner consistent with the scope of the disclosure, as set forth in the following claims.

What is claimed is:

1. A combination of solar cell and supporting layer stack, said combination comprising:
   a solar cell; and
   a solar cell supporting layer stack adjacent to and mechanically supporting said solar cell, said supporting layer stack comprising:
   two skin layers;
   a closed-cell, rigid foam layer having a thickness that is between 1 mm and about 12 mm, and wherein said closed-cell, rigid foam layer is made from at least one material selected from a group consisting of polyethylene terephthalate, and polyethylene naphthalate, wherein said closed-cell, rigid foam layer has a density of from 25 to 300 kg/m$^3$, a compression strength of from 0.6 MPa to 7.5 MPa, a compression modulus of from 40 to 400 MPa, a shear strength from 0.4 to 4.5 MPa and a shear modulus of from 10 to 100 MPa,
   wherein said closed-cell, rigid foam layer does not absorb moisture; and
   wherein said closed-cell, rigid foam layer is disposed between said two skin layers.

2. The combination of claim 1, further comprising an adhesive layer disposed between at least one of the two skin layers and said rigid foam layer.

3. The combination of claim 1, wherein said closed cell, rigid foam layer has a thickness that is between about 1 mm and about 5 mm.

4. The combination of claim 1, wherein one of the two skin layers is made from at least one material selected from a group consisting of polyvinyl fluoride; polymer of tetrafluoroethylene, hexafluoropropylene fluoride, vinylidene fluoride; polyvinylidene fluoride; tetrafluoroethylene co-polymer; ethylene chlorotrifluoroethylene; polyethylene terephthalate; polyethylene naphthalate, polyamide-12; polyamide-11; polymethyl methacralate; polycarbonate; polybutylene terephthalate; aluminum, stainless steel, galvanized steel, titanium, copper, molybdenum, polyethylene resin with glass fiber and polypropylene resin with glass fiber.

5. The combination of claim 1, wherein at least one of the two skin layers is made from aluminum.

6. The combination of claim 1, wherein at least one of the two skin layers is made from stainless steel.

7. The combination of claim 1, wherein at least one of the two skin layers has a thickness that is between about 0.025 mm and about 3.0 mm.

8. The combination of claim 1, wherein one of the two skin layers is an insulating layer such that said insulating layer electrically isolates said supporting layer stack from said solar cell.

9. The combination of claim 1, wherein at least one of the two skin layers is resistant to solar UV energy.

10. The combination of claim 1, wherein at least one of the two skin layers has a vapor transmission of less than 0.05 GM/m/day.

11. The combination of claim 1, wherein said closed cell, rigid foam layer is fused with one of the two skin layers to form said supporting layer stack.

* * * * *